United States Patent [19]
Carson

[11] Patent Number: 4,542,534
[45] Date of Patent: Sep. 17, 1985

[54] SINGLE-SIDEBAND FM

[75] Inventor: David N. Carson, Maplewood, N.J.

[73] Assignee: AT&T Bell Laboratories, Murray Hill, N.J.

[21] Appl. No.: 585,454

[22] Filed: Mar. 2, 1984

[51] Int. Cl.[4] .............................................. H04B 1/16
[52] U.S. Cl. .................................... 455/208; 455/214; 375/50; 329/123
[58] Field of Search .................. 455/42, 47, 205, 208, 455/209, 211, 214, 203; 375/50; 329/123

[56] References Cited
U.S. PATENT DOCUMENTS

| | | | |
|---|---|---|---|
| 3,213,367 | 10/1965 | Ravenscroft | 375/50 |
| 3,746,996 | 7/1973 | Peoples | 455/203 |
| 4,074,198 | 2/1978 | Furuya | 375/50 |

OTHER PUBLICATIONS

Electronic Design, Jul. 8, 1971, "SSB-FM: When Should You Use It?", pp. 74-75.

Primary Examiner—Jin F. Ng
Attorney, Agent, or Firm—John K. Mullarney

[57] ABSTRACT

A single-sideband FM receiver comprises an input (RF) stage (13), a mixer (14), a local oscillator (15) an intermediate frequency (IF) amplifier (16), and an FM detector (18). An oscillator (17) is phase and frequency locked to the IF frequency. The output of this phase-locked oscillator is coupled to the FM detector via a bandpass filter (20) and an amplitude control circuit (19), which controls the level of the signal delivered to the FM detector (18). In the detector (18), the output of the phase-locked oscillator (17) adds a component which is equivalent in phase and frequency to the carrier term received from the IF amplifier (16). This feedforward signal from the phase-locked oscillator reduces harmonic distortion.

2 Claims, 1 Drawing Figure

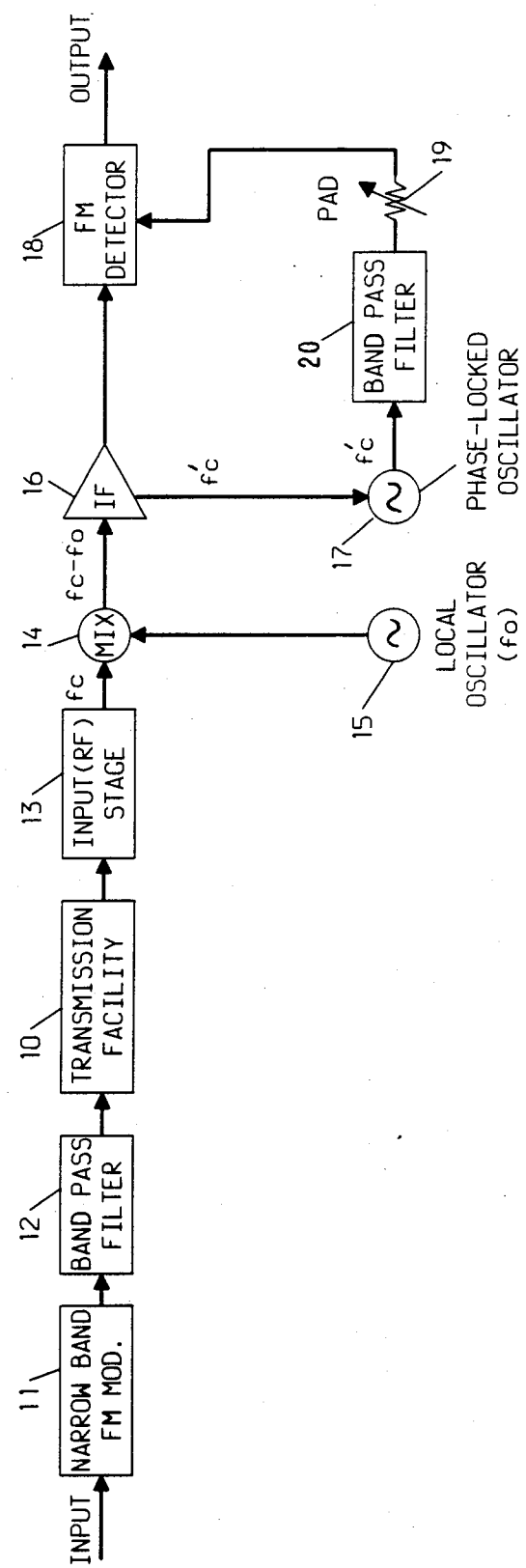

SINGLE-SIDEBAND FM

TECHNICAL FIELD

This invention relates to distortion reduction in low-index single-sideband FM (SSB-FM) systems.

BACKGROUND OF THE INVENTION

Single-sideband FM is an advantageous transmission technique particularly for narrowband applications such as mobile telephony, telemetry, or in any other application where bandwidth savings are important.

SSB-FM systems analyzed in the literature use the Hilbert transform to generate a signal which is simultaneously amplitude and frequency modulated, both components being single-sideband; see, for example, the article "SSB-FM: When should You Use It?", *Electronic Design*, July 8, 1971, pp. 74–75. The disadvantage of the approach suggested in this article is that the circuitry is complex and the system becomes wasteful of power as the modulation index is increased.

SUMMARY OF THE INVENTION

An FM system, in accordance with the present invention, has a modulation index substantially less than one ($<1$), so that sidebands higher than first order can be neglected; only the carrier and one first-order sideband is transmitted. As is known, the performance of such a system is essentially the same as double-sideband low-index FM, except for even-order distortion, which is much greater for a given index of modulation. However, in accordance with the invention, this distortion can be made as low as in the double-sideband case; in fact, it can be lowered to any desired value. The key to lowering the distortion is contained in the following equation for the ratio, $r_m$, of the mth harmonic to the fundamental at the output of an ideal FM detector:

$$r_m = \left(\frac{J_1}{J_o}\right)^{m-1}$$

where $J_1$ is the amplitude of the transmitted sideband, and $J_0$ is the amplitude of the carrier term.

Since this ratio is inversely proportional to the carrier term ($J_0$), increasing the value of the carrier term at the receiver will lower the value of $r_m$. Thus, the harmonic distortion can be reduced to any value desired by injecting carrier at the detector of the receiver. This also reduces the desired signal (M=1), but this reduction varies inversely with the first power of $J_0$, while the distortion terms are reduced inversely as $J_0$ to a power (2,3,4,etc.). Although not explicit in the equation for $r_m$, it is implicit that the injected carrier supply be phase-locked to the received carrier.

BRIEF DESCRIPTION OF THE DRAWING

The single FIGURE is a schematic block diagram of a single-sideband FM system in accordance with the present invention.

DETAILED DESCRIPTION

Consider the FM wave with single-frequency modulating component:

$$\cos(pt + x \sin qt) = \sum_{n=-\infty}^{\infty} J_n(x) \cos(pt + nq)t$$

The carrier and lower sideband frequency components constitute the transmitted wave:

$$E(t) = J_{-1}(x) \cos(p-q)t + J_0(X) \cos pt$$
$$= J_0(x) \cos pt - J_1(X) \cos qt \cos pt - J_1(x) \sin pt \sin qt$$
$$= [J_0(x) - J_1(x) \cos qt] \cos pt - J_1(x) \sin qt \sin pt$$
$$= A(t) \cos[pt + \phi(t)], \text{ where}$$
$$A^2(t) = J_0^2(x) + J_1^2(x) - 2J_0(x) J_1(x) \cos qt$$
$$\tan \phi(t) = \frac{J_1(x) \sin qt}{J_0(x) - J_1(x) \cos qt}$$

An ideal frequency detector gives the response $$F(t) = \frac{d}{dt}[pt + \phi(t)] = p + \phi'(t)$$

It is convenient to abbreviate $J_0(x)$ and $J_1(x)$ by $J_0$ and $J_1$ respectively. We calculate $$\phi'(t) = \frac{q J_1 (J_0 \cos qt - J_1)}{J_0^2 + J_1^2 - 2J_0 J_1 \cos qt}$$

The series $$\sum_{m=1}^{\infty} \left(\frac{b}{a}\right)^m \cos m\theta, \; b < a$$

is readily summed as the real part of a geometric series in $b e^{i\theta}/a$ to obtain the formula:

$$\frac{b(a \cos \theta - b)}{a^2 + b^2 - 2ab \cos\theta} = \sum_{m=1}^{\infty} \left(\frac{b}{a}\right)^m \cos m\theta, \; b < a$$

Hence $$\phi'(t) = q \sum_{m=1}^{\infty} \left(\frac{J_1}{J_o}\right)^m \cos mqt$$

The ratio of the amplitude of the mth harmonic to that of the fundamental is therefore given by $$r_m = \left(\frac{J_1}{J_o}\right)^{m-1}$$

Since this ratio is inversely proportional to the carrier term ($J_0$), increasing the value of the carrier at the receiver will lower the value of $r_m$. Thus, the harmonic distortion ($M \geq 2$) can be reduced to any value desired by injecting carrier (in-phase) at the detector of the receiver.

Referring now to the drawing, at the transmitter an input signal is applied to the narrow-band FM modulator 11. The output of this FM modulator is then coupled to the band pass filter 12. This filter passes the carrier and one first-order sideband, either the upper or the lower. From the output of the filter, the signal is coupled to a transmission facility 10, such as radio, lightguide, coaxial cable, or any other transmission facility known to those in the art.

The transmitted signal upon reception is coupled to an input stage 13 such as an RF amplifier. This input signal will comprise the carrier term and the upper or lower sideband of the signal prior to filtering in the transmitter. For convenience, the carrier whose amplitude is $J_0$ can be represented by its frequency, $f_c$. The output ($f_c$) of this input stage is then coupled to a mixer 14. At the output of the mixer an intermediate frequency signal is obtained which is the difference between the carrier term ($f_c$) and the local oscillator frequency ($f_0$). The term $f_0$ is derived from a local oscillator 15 of conventional design. This difference signal is amplified in an IF amplifier 16 and delivered to the FM detector 18. At the IF amplifier, the IF frequency corresponding to the original carrier, labeled on the drawing $f'_c$, is used to synchronize a phased-locked oscillator 17. The term $f'_c$ is the frequency of the carrier term ($f_c$) appearing in the IF amplifier. This signal is used to synchronize the phase-locked oscillator 17. The output of the phase-locked oscillator 17 is the signal $f'_c$ which is delivered to a pad 19 via the band-pass filter 20 which passes just the frequency $f'_c$. This pad is used to vary the level of the signal $f'_c$ which is injected (in-phase) into the FM detector 18 along with the IF signal from the IF amplifier 16. Either a pad or a variable amplifier may be used as the means to control the amplitude of the signal injected into detector 18. The output of the detector contains the original modulation and the distortion, which at that point can be lowered to any desirable value by means of adjustment of pad 19, which controls the amount of injected carrier ($f'_c$).

In the detector 18, the output of the phase-locked oscillator 17 adds a component (returning to the previous notation), $J_0$, which is equivalent in phase and frequency to the carrier term received from the IF amplifier 16, and by making $J_0$ large with respect to $J_1$ the ratio of the amplitude of a given harmonic is reduced to any desired value. The output of the FM detector 18 consists of the original signal applied to the transmitter 11 plus a distortion term, which is reduced by the injection of the output of the phase-lock oscillator 17 into the detector 18.

While a specific embodiment of the invention has been described in detail, it is to be understood that numerous other embodiments may be devised by those skilled in the art without departing from the spirit and scope of the invention.

What is claimed is:

1. In a single-sideband FM receiver for receiving a single sideband signal from a FM transmitter which comprises an input stage, a mixer stage, an IF amplifier and an FM detector coupled in tandem, said receiver being characterized by phase-locked oscillator means coupled to the IF amplifier for producing a phase-locked carrier signal which is equivalent in phase and frequency to the carrier signal at the output of the IF amplifier, and amplitude control means for coupling the signal from the phase-locked oscillator means to said FM detector, said control means serving to control the amplitude of the phase-locked carrier signal injected into said FM detector to thereby reduce harmonic distortion of the output of said FM detector to a predetermined value.

2. In a single-sideband receiver as defined in claim 1 wherein, at the output of said FM detector, the ratio, $r_m$, of the amplitude of the mth harmonic to the fundamental is $$r_m = \left(\frac{J_1}{J_o}\right)^{m-1}$$

where $J_1$ is the amplitude of the transmitted sideband and $J_0$ is the amplitude of the fundamental, the value of $r_m$ being lowered by said amplitude control means by increasing the amplitude of the injected carrier.

* * * * *